(12) United States Patent
Kanagaraj et al.

(10) Patent No.: US 10,020,785 B2
(45) Date of Patent: Jul. 10, 2018

(54) AUTOMATIC VEHICLE OCCUPANT AUDIO CONTROL

(71) Applicant: Panasonic Automotive Systems Company of America, Division of Panasonic Corporation of North America, Peachtree City, GA (US)

(72) Inventors: Padmanaban Kanagaraj, Farmington Hills, MI (US); Katherine Jennette Freund, Livonia, MI (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

(21) Appl. No.: 15/829,497

(22) Filed: Dec. 1, 2017

(65) Prior Publication Data

US 2018/0167044 A1    Jun. 14, 2018

Related U.S. Application Data

(60) Provisional application No. 62/431,852, filed on Dec. 9, 2016.

(51) Int. Cl.
*H04B 1/00* (2006.01)
*H03G 3/20* (2006.01)
*H04R 3/00* (2006.01)
*G06K 9/20* (2006.01)
*G06K 9/00* (2006.01)

(52) U.S. Cl.
CPC ........... *H03G 3/20* (2013.01); *G06K 9/00845* (2013.01); *G06K 9/209* (2013.01); *H04R 3/00* (2013.01); *H04R 2430/01* (2013.01)

(58) Field of Classification Search
CPC ........ H04R 3/00; H04R 2430/01; H03G 3/20; G06K 9/00845; G06K 9/209
USPC .......................................................... 381/86
See application file for complete search history.

(56) References Cited

U.S. PATENT DOCUMENTS

2012/0327232 A1*  12/2012  Yang ................... B60N 2/0248
                                                                   348/148

\* cited by examiner

*Primary Examiner* — Paul S Kim
(74) *Attorney, Agent, or Firm* — Laurence S. Roach, Esq.

(57) ABSTRACT

An audio control arrangement for a motor vehicle includes a camera capturing images of a passenger of the motor vehicle. A processor is communicatively coupled to the camera and determines, based on the captured images, whether the passenger is at least partially asleep. An audio system is communicatively coupled to the processor and reduces a volume of an audio signal in response to the processor determining that the passenger is at least partially asleep. A loudspeaker is communicatively coupled to the audio system and emits sounds based on the audio signal.

19 Claims, 3 Drawing Sheets

AUTOMATIC VEHICLE OCCUPANT AUDIO CONTROL

CROSS-REFERENCED TO RELATED APPLICATIONS

This application claims benefit of U.S. Provisional Application No. 62/431,852 filed on Dec. 9, 2016, which the disclosure of which is hereby incorporated by reference in its entirety for all purposes.

FIELD OF THE INVENTION

The disclosure relates to an audio system, and, more particularly, an audio system in a motor vehicle.

BACKGROUND OF THE INVENTION

Vehicular audio systems may keep passengers awake if they are trying to fall asleep. The driver may be unaware that the passengers are falling asleep, and thus may not turn down the volume of the audio system. There is no known system that informs the infotainment system when an occupant starts to fall asleep.

Another problem is that conversation is difficult within the vehicle while audio is playing too loudly. Often, drivers will manually turn down the volume when trying to have a conversation.

SUMMARY

The present invention may provide a vehicle system that detects, via internal occupant-monitoring cameras, when non-driver occupants (including young children in car seats) are falling asleep, and, in response, automatically attenuates the audio being played. It is also possible for the system, in response to detecting that non-driver occupants are falling asleep, to change the audio source into soothing sound/music in order to lull children to sleep.

This system may also detect when occupants are talking, and, in response, may attenuate the audio in order to improve the intelligibility of the conversion. Particularly, the system may detect when occupants are talking and turn down the audio in real time according to occupant speech. That is, the audio volume may be turned down instantaneously in response to an occupant moving his lips to speak, and the audio volume may be turned back up when the occupants stop moving their lips to speak.

In one embodiment, the invention comprises an audio control arrangement for a motor vehicle, including a camera capturing images of a passenger of the motor vehicle. A processor is communicatively coupled to the camera and determines, based on the captured images, whether the passenger is at least partially asleep. An audio system is communicatively coupled to the processor and reduces a volume of an audio signal in response to the processor determining that the passenger is at least partially asleep. A loudspeaker is communicatively coupled to the audio system and emits sounds based on the audio signal.

In another embodiment, the invention comprises an automotive audio control method, including capturing images of a passenger of a motor vehicle while he is in the passenger compartment. It is determined, based on the captured images, whether the passenger is at least partially asleep. A volume of an audio signal is reduced in response to determining that the passenger is at least partially asleep. Sounds are emitted based on the audio signal.

In yet another embodiment, the invention comprises an audio arrangement for a motor vehicle, including at least one camera capturing images of a plurality of occupants of the motor vehicle. A processor is communicatively coupled to the at least one camera and determines, based on the captured images, whether at least one of the occupants is speaking. An audio system is communicatively coupled to the processor and reduces a volume of an audio signal in response to the processor determining that at least one of the occupants is speaking. A loudspeaker is communicatively coupled to the audio system and emits sounds based on the audio signal.

An advantage of the present invention is that it may automatically turn the audio volume down in the event that sensors determine that vehicle occupants are sleeping or talking.

BRIEF DESCRIPTION OF THE DRAWINGS

A better understanding of the present invention will be had upon reference to the following description in conjunction with the accompanying drawings.

DETAILED DESCRIPTION OF THE PREFERRED EMBODIMENTS

Figure 1:
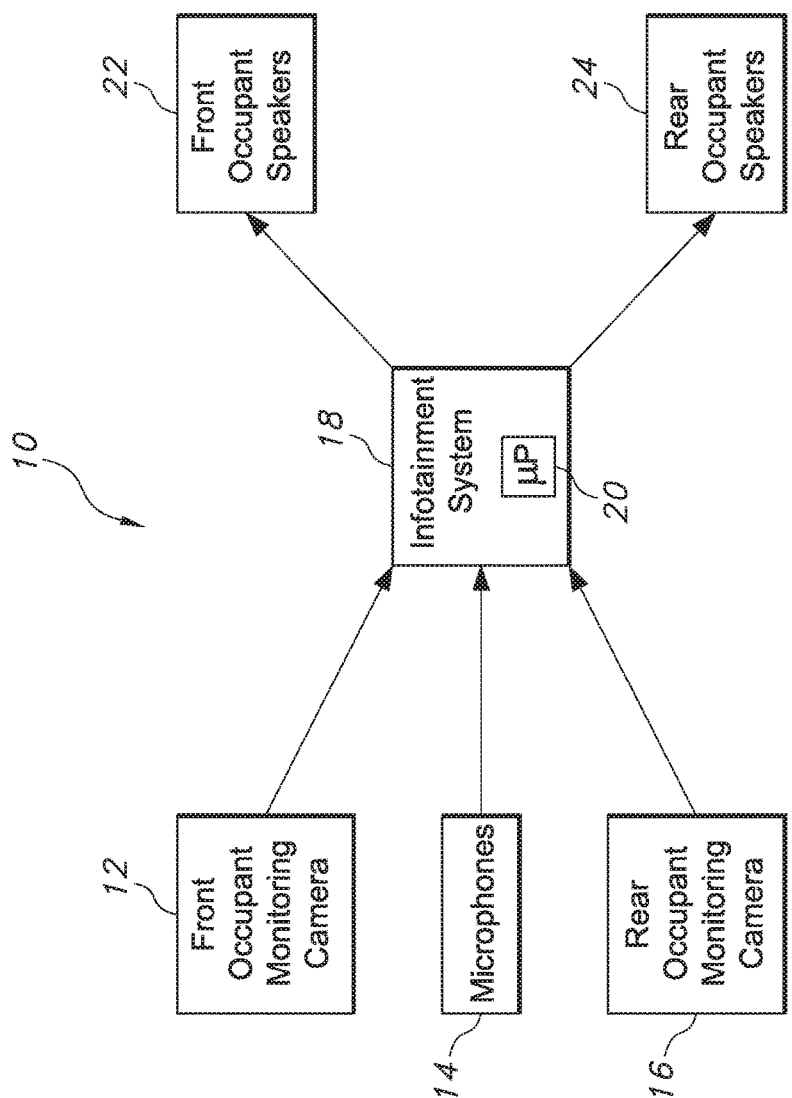
FIG. 1 is a block diagram of one embodiment of an audio control arrangement of the present invention.

FIG. 1 illustrates one embodiment of an audio control arrangement 10 of the present invention, including a front occupant monitoring camera 12, microphones 14, a rear occupant monitoring camera 16, an infotainment system 18 having a microprocessor 20, front occupant loudspeakers 22, and rear occupant loudspeakers 24. Microphones 14 may include a front seat microphone 26 (FIG. 2) and a rear seat microphone 28.

Figure 2:
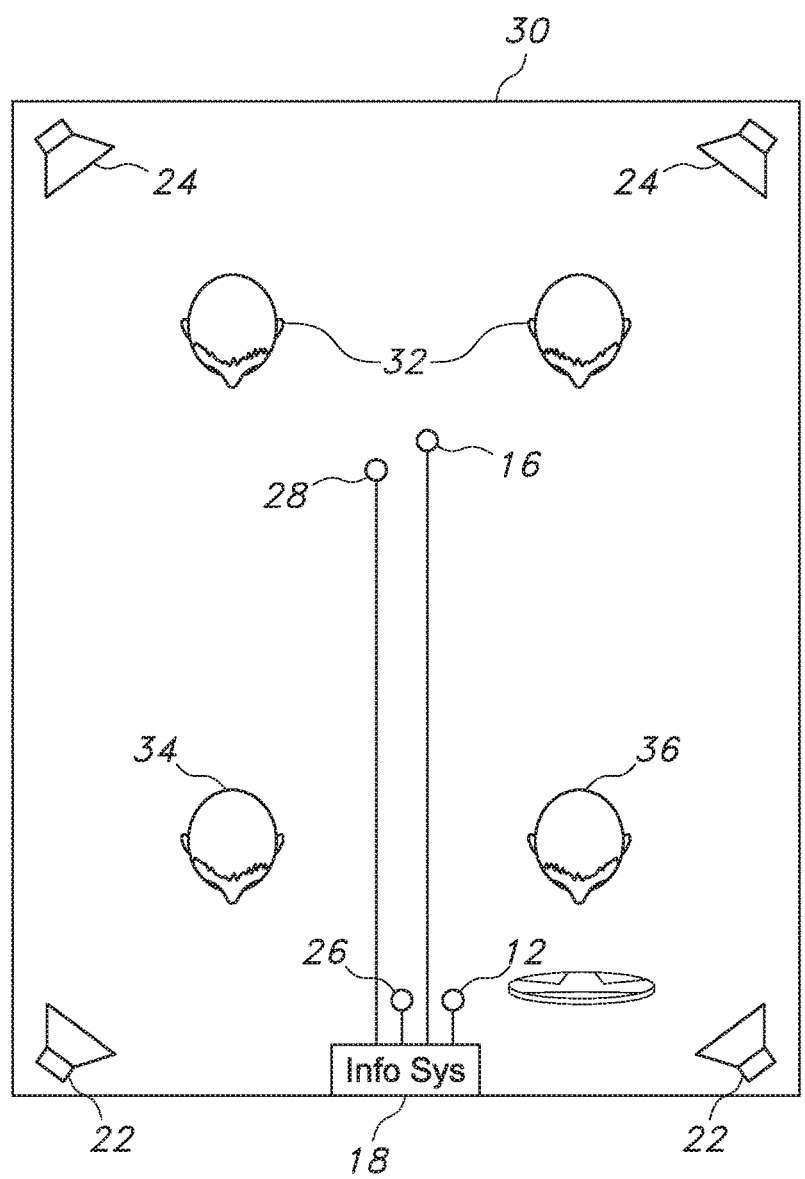
FIG. 2 is a schematic diagram of a vehicle including the audio control arrangement of FIG. 1.

FIG. 2 illustrates a motor vehicle 30 including audio control arrangement 10 of FIG. 1. Rear seat passengers 32 may be monitored by rear occupant monitoring camera 16 and rear seat microphone 28. Rear seat passengers 32 may hear rear occupant loudspeakers 24 primarily. Front passenger 34 may be monitored by front occupant monitoring camera 12 and front seat microphone 26. Front seat passenger 34 may hear front occupant loudspeakers 22 primarily.

During use, a driver 36 may not notice that one or more of passengers 32, 34 are falling asleep, and thus may not turn down the audio volume played by infotainment system 18. Cameras 12, 16 may capture images of passengers 34, 32, respectively. Based upon the images received from cameras 12, 16, infotainment system 18 may reduce or increase the volume of the sound emitted by loudspeakers 22, 24 due to the images indicating that one or more passengers 32, 34 are falling asleep or waking up, respectively. As the occupants move their heads and close or blink their eyes, for example, the volume may be adjusted periodically in order to keep up with the changing sleep states or awake states of the vehicle's occupants. It may be determined that the passenger is at least partially asleep based on a head position of the passenger and how often the passenger's eyes are closed in the captured images.

If there are multiple loudspeakers within the passenger compartment of the vehicle, as shown in FIG. 2, the speakers may be located at spaced out locations with different orientations. Thus, the sound emitted by each of the loudspeakers may be adjusted differently based upon each speaker's location and orientation relative to the occupants' ears. For example, if only front seat occupant 34 is falling asleep, then volume may be turned down on either all speakers 22, 24, or only on front speakers 22. If only a rear seat occupant 32 is falling asleep, then volume may be turned down on either all speakers 22, 24, or only on rear speakers 24. Conversely, volume may be turned back up in the above scenarios when it is determined from the captured images that the occupant is waking up. As described above, volume may be adjusted only on the speaker(s) primarily heard by the occupant whose sleep state is changing. It is also possible for a same or similar adjustment to be made to the sound emitted by each speaker.

It is also possible that a driver 36 may not notice that one or more of passengers 32, 34 are having a conversation, and thus may not turn down the audio volume played by infotainment system 18 in order to help the conversation participants hear each other better. Cameras 12, 16 may capture images of passengers 34, 32, respectively, and microphones 26, 28 may detect words spoken by passengers 32, 34. Based upon the images received from cameras 12, 16, and/or based upon the microphone signals, infotainment system 18 may reduce or increase the volume of the sound emitted by loudspeakers 22, 24 due to the images and microphone signals indicating that a conversation has begun or has ended, respectively. As the occupants move their lips and speak words detected by the microphone(s), for example, the volume may be turned down so long as the images and microphone signals indicate that the conversation is being continued by the vehicle's occupants.

If only front seat occupant 34 is involved in a conversation, perhaps on his mobile phone or with driver 36, then volume may be turned down on either all speakers 22, 24, or only on front speakers 22. If only one or both of rear seat occupants 32 is involved in a conversation, then volume may be turned down on either all speakers 22, 24, or only on rear speakers 24. Conversely, volume may be turned back up in the above scenarios when it is determined from the captured images and/or from the microphone signals that the conversation has ended. As described above, volume may be adjusted only on the speaker(s) primarily heard by the occupant who is, or has been, involved in a conversation. It is also possible for a same or similar adjustment to be made to the sound emitted by each speaker.

Figure 3:
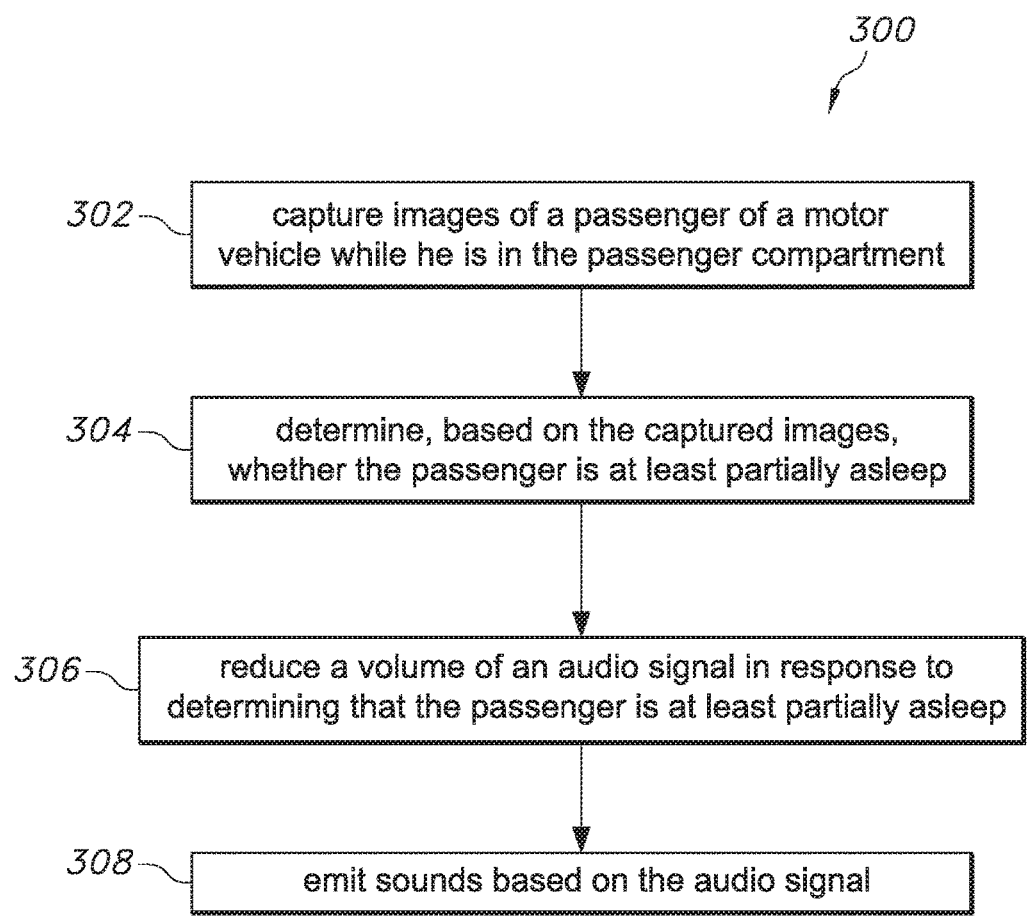
FIG. 3 is a flow chart of one embodiment of an automotive audio control method of the present invention.

FIG. 3 illustrates one embodiment of an automotive audio control method 300 of the present invention. In a first step 302, images of a passenger of a motor vehicle are captured while he is in the passenger compartment. For example, camera 12 may capture images of a front seat passenger 34, and camera 16 may capture images of rear seat passengers 32.

Next, in step 304, it is determined, based on the captured images, whether the passenger is at least partially asleep. For example, processor 20 in infotainment system 18 may determine, based on the images captured by camera 12 and/or camera 16, whether a passenger 32, 34 is at least partially asleep. More particularly, processor 20 may determine, from the captured images, movements of the eyelids of passenger 32, 34, whether the eyelids are closed, how long the eyelids are closed, and/or whether the passenger's head is nodding. Based on these determinations, processor 20 may determine whether the passenger is at least partially asleep.

In a next step 306, a volume of an audio signal is reduced in response to determining that the passenger is at least partially asleep. For example, processor 20 may reduce the volume of the audio signal that processor 20 produces in response to determining that the passenger is at least partially asleep.

In a final step 308, sounds are emitted based on the audio signal. For example, processor 20 may transmit the audio signal to loudspeakers 22 and/or loudspeakers 24, and one or more of the loudspeakers may emit sounds based on the received audio signal.

The foregoing description may refer to "motor vehicle", "automobile", "automotive", or similar expressions. It is to be understood that these terms are not intended to limit the invention to any particular type of transportation vehicle. Rather, the invention may be applied to any type of transportation vehicle whether traveling by air, water, or ground, such as airplanes, boats, etc.

The foregoing detailed description is given primarily for clearness of understanding and no unnecessary limitations are to be understood therefrom for modifications can be made by those skilled in the art upon reading this disclosure and may be made without departing from the spirit of the invention.

What is claimed is:

1. An audio control arrangement for a motor vehicle, comprising:
   a camera configured to capture images of a passenger of the motor vehicle; a processor communicatively coupled to the camera and configured to determine, based on the captured images, whether the passenger is at least partially asleep;
   an audio system communicatively coupled to the processor and configured to reduce a volume of an audio signal in response to the processor determining that the passenger is at least partially asleep; and
   a loudspeaker communicatively coupled to the audio system and configured to emit sounds based on the audio signal;
   wherein the loudspeaker comprises a first loudspeaker of a plurality of loudspeakers, the audio system being configured to adjust a respective volume of each of a plurality of audio signals dependent upon a respective wake state of each of a plurality passengers and such that each volume is adjusted differently, each said loudspeaker receiving a respective said audio signal.

2. The audio control arrangement of claim 1 wherein the audio system is configured to increase the volume of the audio signal in response to the processor determining that the passenger is waking up from sleep.

3. The audio control arrangement of claim 1 wherein the loudspeaker is configured to emit the sounds into a passenger compartment of the motor vehicle.

4. The audio control arrangement of claim 1 wherein the processor is configured to determine, based on the captured images, whether the passenger is speaking, the audio system being configured to reduce the volume of the audio signal in response to the processor determining that the passenger is speaking.

5. The audio control arrangement of claim 1 wherein the audio system is configured to automatically adjust the volume of the audio signal with a frequency of at least once per second, the adjusting being dependent upon changes in a wake state of the passenger.

6. The audio control arrangement of claim 1 wherein the processor is configured to determine that the passenger is at least partially asleep based on a head position of the passenger and how often the passenger's eyes are closed in the captured images.

7. An automotive audio control method, comprising:
capturing images of a passenger of a motor vehicle while he is in the passenger compartment;
determining, based on the captured images, whether the passenger is at least partially asleep;
reducing a volume of an audio signal in response to determining that the passenger is at least partially asleep; and
emitting sounds based on the audio signal;
wherein reducing the volume comprises adjusting a respective volume of each of a plurality of audio signals dependent upon a respective wake state of each of a plurality passengers and such that each volume is adjusted differently, a respective sound being emitted based on each respective said audio signal.

8. The method of claim 7 further comprising increasing the volume of the audio signal in response to determining that the passenger is waking up from sleep.

9. The method of claim 7 wherein the sounds are emitted into a passenger compartment of the motor vehicle.

10. The method of claim 7 further comprising:
determining, based on the captured images, whether the passenger is speaking; and
reducing the volume of the audio signal in response to the processor determining that the passenger is speaking.

11. The method of claim 7 wherein the volume of the audio signal is automatically adjusted with a frequency of at least once per second, the adjusting being dependent upon changes in a wake state of the passenger.

12. The method of claim 7 wherein the determining step includes determining that the passenger is at least partially asleep based on a head position of the passenger and how often the passenger's eyes are closed in the captured images.

13. An audio control arrangement for a motor vehicle, comprising:
at least one camera configured to capture images of a plurality of occupants of the motor vehicle;
a processor communicatively coupled to the at least one camera and configured to determine, based on the captured images, whether at least one of the occupants is speaking;
an audio system communicatively coupled to the processor and configured to reduce a volume of an audio signal in response to the processor determining that at least one of the occupants is speaking; and
a loudspeaker communicatively coupled to the audio system and configured to emit sounds based on the audio signal;
wherein the loudspeaker comprises a first loudspeaker of a plurality of loudspeakers, the audio system being configured to adjust a respective volume of each of a plurality of audio signals dependent upon whether a respective one of the occupants is speaking and such that each volume is adjusted differently, each said loudspeaker receiving a respective said audio signal.

14. The audio control arrangement of claim 13 further comprising a microphone associated with a passenger compartment of the motor vehicle and communicatively coupled to the processor, the processor being configured to determine, based on a signal from the microphone, whether at least one of the occupants is speaking.

15. The audio control arrangement of claim 13 wherein the audio system is configured to increase the volume of the audio signal in response to the processor determining that the occupant has stopped speaking.

16. The audio control arrangement of claim 13 wherein the loudspeaker is configured to emit the sounds into a passenger compartment of the motor vehicle.

17. The audio control arrangement of claim 13 wherein the processor is configured to determine, based on the captured images, whether at least one of the occupants is sleeping, the audio system being configured to reduce the volume of the audio signal in response to the processor determining that at least one of the occupants is sleeping.

18. The audio control arrangement of claim 13 wherein the audio system is configured to automatically adjust the volume of the audio signal with a frequency of at least once per second, the adjusting being dependent upon changes in whether at least one said occupant is speaking.

19. The audio control arrangement of claim 13 wherein the processor is configured to determine that the occupant is speaking based on movements of lips of a mouth of the occupant.

* * * * *